United States Patent
Kanda

(10) Patent No.: US 8,061,022 B2
(45) Date of Patent: Nov. 22, 2011

(54) METHOD FOR MANUFACTURING HYBRID PRINTED CIRCUIT BOARD

(75) Inventor: Takashi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 791 days.

(21) Appl. No.: 12/046,961

(22) Filed: Mar. 12, 2008

(65) Prior Publication Data

US 2008/0222885 A1  Sep. 18, 2008

(30) Foreign Application Priority Data

Mar. 14, 2007  (JP) ................. 2007-065843

(51) Int. Cl.
*H01R 9/00* (2006.01)
*H05K 3/00* (2006.01)

(52) U.S. Cl. .............. 29/843; 29/831; 29/840; 257/680; 438/106

(58) Field of Classification Search ............ 29/830–832, 29/840, 843, 846, 852; 174/250, 260; 257/680, 257/772, 778; 438/106, 612, 613
See application file for complete search history.

(56) References Cited

U.S. PATENT DOCUMENTS

| 5,801,446 | A | * | 9/1998 | DiStefano et al. ............ 257/778 |
| 6,140,707 | A | * | 10/2000 | Plepys et al. .................. 257/778 |
| 6,687,985 | B2 | * | 2/2004 | Sakamoto et al. .............. 29/831 |
| 2004/0183193 | A1 | | 9/2004 | Koide et al. |
| 2005/0266213 | A1 | | 12/2005 | Kanda et al. |

FOREIGN PATENT DOCUMENTS

JP  2000-332057  11/2000

* cited by examiner

*Primary Examiner* — Donghai D. Nguyen

(74) *Attorney, Agent, or Firm* — Staas & Halsey LLP

(57) ABSTRACT

A method for manufacturing a hybrid printed circuit board having two kinds of wiring boards. The circuit board has method has a first wiring board having a first terminal and, a second wiring board wherein a dent wherein the first wiring board is fitted and equipped with a second terminal is formed, and forming the same plane as the first wiring board. The board also has an insulating adhesive material disposed around the first terminal, and a conductive adhesive joining the first terminal with the second terminal.

3 Claims, 7 Drawing Sheets

METHOD FOR MANUFACTURING HYBRID PRINTED CIRCUIT BOARD

CROSS-REFERENCE TO RELATED APPLICATIONS

This application is related to and claims the benefit of priority from Japanese Patent Application No. 2007-65843, filed on Mar. 14, 2007, the entire contents of which are incorporated herein by reference.

BACKGROUND

1. Field of the Invention

The present invention relates to a method for manufacturing a hybrid printed circuit board.

2. Description of the Related Art

A hybrid printed circuit board refers to a composite printed circuit board wherein electronic parts are mounted on a printed circuit board.

A package wherein electronic parts are electrically connected to the circuit surface of a semiconductor chip via arrayed metal electrodes (bumps) is referred to as flip chip packaging.

A typical flip chip is a ball grid array (BGA) package.

The BGA package is a kind of package boards wherein LSIs, such as a CPU, and other electronic parts, such as capacitors, and they are connected to a printed circuit board (also known as "system board" or "mother board") by soldering.

The BGA package has a plurality of solder balls (the solder balls are also referred to as "BGA balls" on the joining surface with the printed circuit board.

For solder balls, the use of lead-free solder is required considering the effect on environment.

As shown in FIG. 10A, upon assembling a package module 10, after mounting an LSI 14 and other electronic parts 17 on a package board 12, solder balls 19 are fixed on grid arrayed pads 18.

The LSI 14 is mounted on the package board 12 via solder balls 15, and an under-fill 16 is filled between the solder balls 15 for reinforcing joining force.

The package module 10 is positioned to and loaded on a printed circuit board 20 wherein footprints 22 have been formed.

Thereafter, these are introduced into a reflow furnace (not shown) by a belt conveyor (not shown) and heated.

Thus, as shown FIG. 10B, the solder balls 19 are melted, and soldered to the footprints 22.

Such an assembling process is referred to as a "reflow" process.

Here, FIGS. 10A and 10B are sectional view for illustrating the manufacture of a conventional hybrid printed circuit board 1.

However, the above-described conventional hybrid printed circuit board 1 has disadvantage of poor electrical characteristics.

Specifically, if lead-free solder is used in solder balls 19, the reflow temperature becomes high.

At this time, when the material for the package board 12 is different from the material for the printed circuit board 20, if a difference in coefficients of thermal expansion is large, thermal stress is applied to the joining portion between the solder balls 19 and the footprints 22, and the reliability of joining is lowered.

Since the solder balls 15 are also re-melted during reflowing, if voids due to air bubbles that are produced by pour soldering, the solder balls 19 melt and flow into the voids causing short-circuiting between the solder balls 15.

Furthermore, the adhesive force of the under-fill 16 is lowered by thermal stress, and the solder balls may be peeled off.

The conventional hybrid printed circuit board 1 also has the disadvantage of low manufacturing efficiency.

Specifically, when a conventional hybrid printed circuit board is assembled, an LSI 14 and electronic parts 17 must be mounted on a package board 12 before mounting the package module 10 on the printed circuit board 20.

In other words, all the electronic parts cannot be collectively mounted on the hybrid printed circuit board 1.

Furthermore, since the package module 10 mounted on the printed circuit board 20 is protruded from the printed circuit board 20, it is easily caught by external members to make handling characteristics poor.

SUMMARY

According to an embodiment an example method for manufacturing such a hybrid printed circuit board includes temporarily applying an insulating adhesive material around one terminal so that the one terminal of a first wiring board having a first terminal and a second wiring board having a first wiring board having a first terminal is exposed.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF THE PREFERRED EMBODIMENTS

Figure 1:
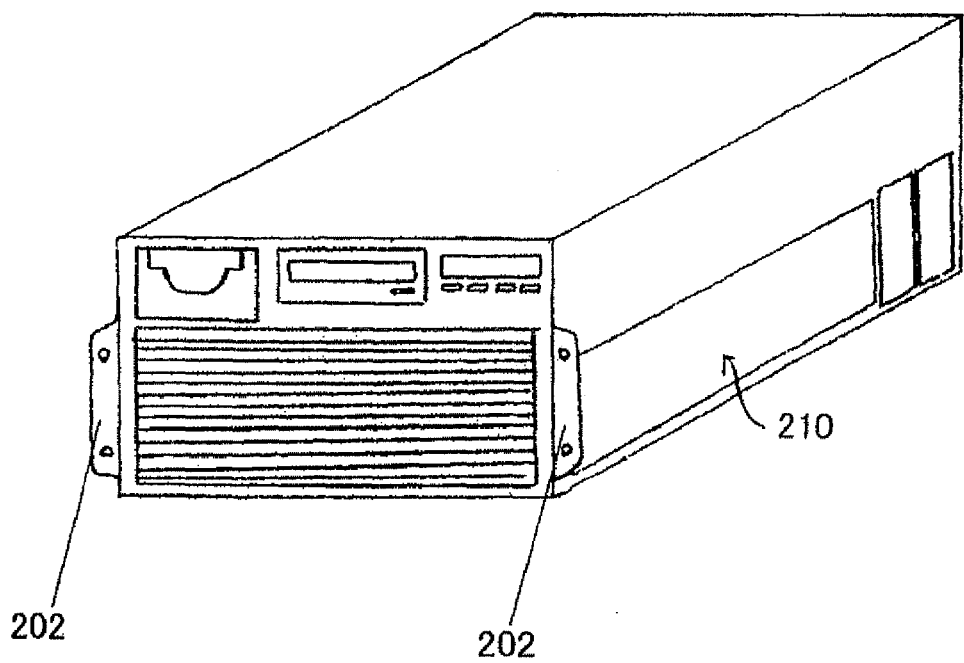
FIG. 1 is a schematic perspective view of an electronic apparatus as an aspect of the present invention.

Reference will now be made in detail to the embodiments, examples of which are illustrated in the accompanying drawings, wherein like reference numerals refer to the like elements throughout. The embodiments are described below to explain an example invention by referring to the figures.

A hybrid printed circuit board 100 as an aspect of the present an example, and a server (electronic apparatus) 200 on which the hybrid printed circuit board 100 are described below referring to the attached drawings.

Here, FIG. 1 is a schematic perspective view of the server 200.

Figure 2:
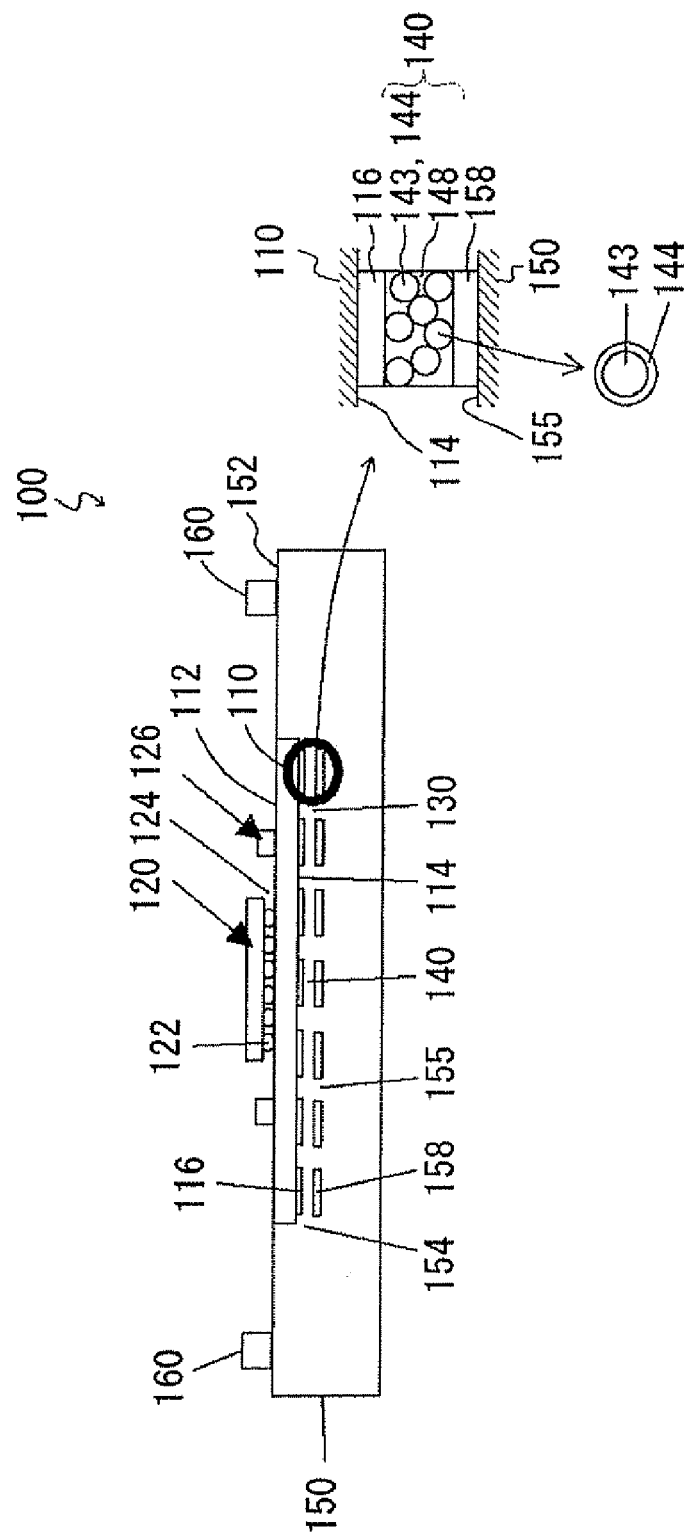
FIG. 2 is a partially enlarged sectional view of a hybrid printed circuit board mounted in the electronic apparatus shown in FIG. 1.

FIG. 2 is a partially enlarged sectional view of the hybrid printed circuit board 100.

As shown in FIG. 1, although the electronic apparatus of the present embodiment is embodied as a rack-mount UNIX server for illustrative purposes, it may be any electronic apparatus wherein a printed circuit board is incorporated, such as PC, PDA (personal digital assistant), a mobile phone, a digital camera, and a tester.

The server 200 is screwed to a rack (not shown) by a pair of fixing portions 202; and contain a hybrid printed circuit board 100 shown in FIG. 2 in a server cabinet 210.

The hybrid printed circuit board 100 has two kinds of wiring board of the package board 110 and a printed circuit board 150, an insulating adhesive material 130, and a conductive adhesive 140.

The package board (first wiring board) 110 is a rigid (non-flexible) board composed of, for example, a resin or ceramics, and has a front surface 112 and a back surface 114.

On the front surface 112, an LSI 120 and electronic parts 126, such as capacitors are mounted.

The LSI 120 is a flip chip, and has a plurality of solder bumps 122 and an under-fill 124.

The LSI 120 is soldered and electrically connected to the package board 110 via bumps 122.

A heat sink for heat dissipating may be formed on the LSI 120 together with a lid or a heat spreader.

A plurality of lattice-like arrayed pads (first terminals) 116 are formed on the back surface 114.

The plurality of pads 116 are electrically connected to the LSI 120 and electronic parts 126.

The kinds of the LSI 120 and electronic parts 126 are not specifically limited. The under-fill 124 is filled in a gap between the LSI 120 and the package board 110 to secure the connection reliability of the bumps 122.

The printed circuit board (second wiring board) 150 is composed of, for example, glass-cloth reinforced epoxy resin, glass cloth bismaleimidotriazine resin, glass cloth polyphenylene ether resin, aramide/polyimide liquid crystal polymer, or the like. The printed circuit board 150 is also a rigid (non-flexible) board, and has a surface 152 and a dent 154.

On the surface 152, electronic parts 160, such as connectors and SMT (surface mounting technology) parts are mounted.

The dent 154 is a depression formed on the surface 152, a plurality of footprints (second terminals) 158 are formed on the bottom portion of the dent 154.

The package boards 110 are fitted in the dent 154.

The footprints 158 are lattice-like arrayed, and electrically connected and joined to respective corresponding pads 116. The surfaces 112 and 152 form the same plane.

The insulating adhesive material 130 is disposed around the pads 116.

The conductive adhesive 140 joins the pads 116 to the footprints 158, and electrically connects the pads 116 to the footprints 158.

As shown in FIG. 2 at its right and its right below with partially enlarged manner, the conductive adhesive 140 is composed of a heat-curing adhesive containing metal particles 143 as a filler having a first melting point whose surfaces are plated with a low-temperature melting solder 144 having a second melting point lower than the first melting point and the thermosetting temperature of the heat-curing adhesive 148.

A method for manufacturing a hybrid printed circuit board 100 will be described referring to FIGS. 2 to 9.

Figure 3:
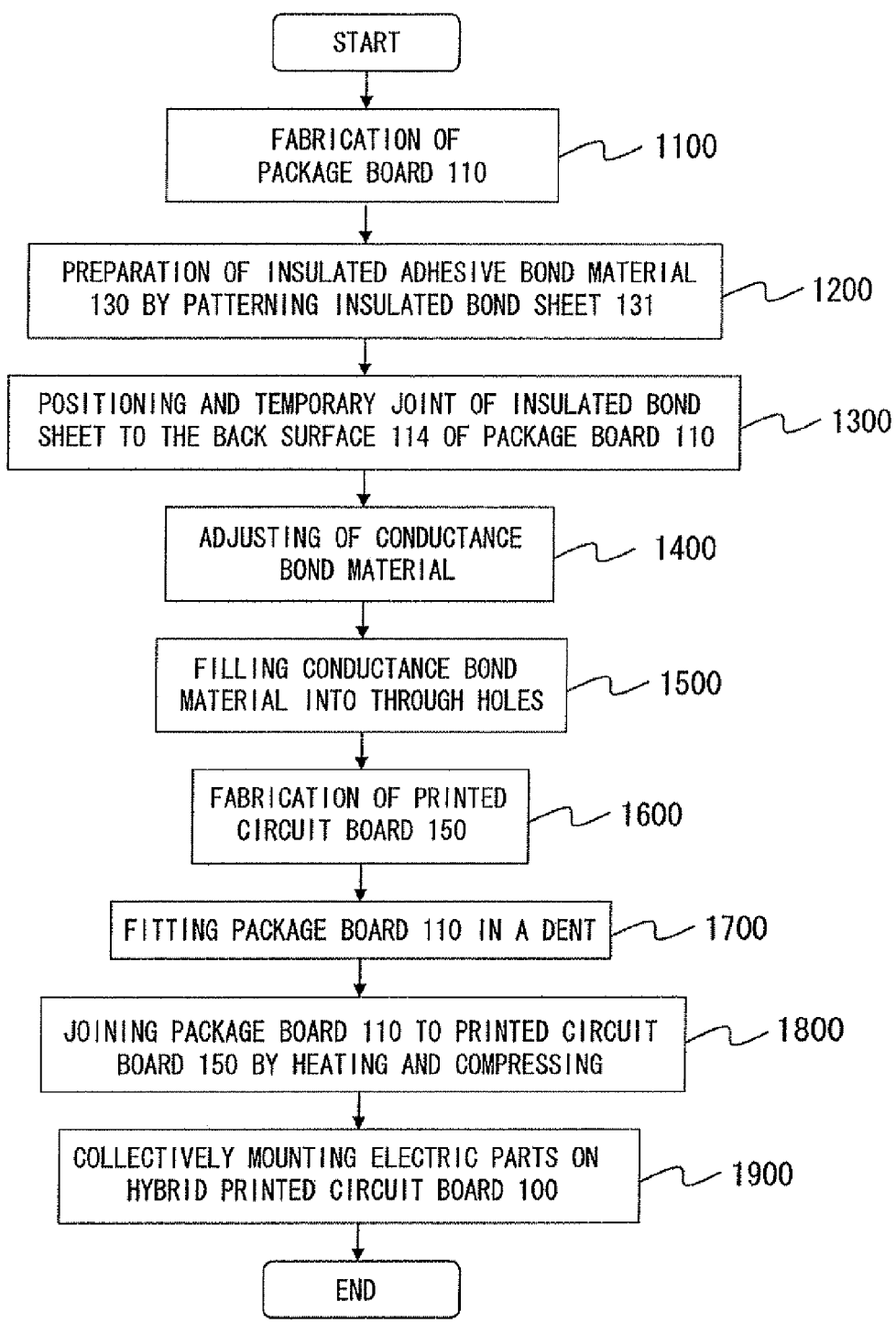
FIG. 3 is a flow chart illustrating an example method for manufacturing a hybrid printed circuit board shown in FIG. 2.

Here, FIG. 3 is a flow chart for illustrating an example method for manufacturing the hybrid printed circuit board 100.

First, package boards 110 are prepared (Operation 1100). If required, quality judgment may be carried out to use only quality product package boards 110.

Figure 4:
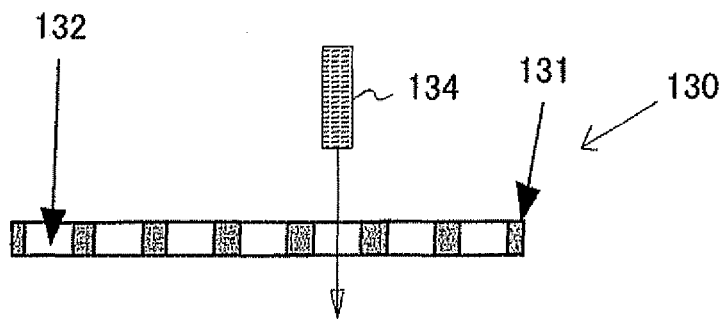
FIG. 4 is a schematic sectional view for illustrating Step 1200 shown in FIG. 3.

Next, an insulating adhesive sheet 131 is patterned to form an insulating adhesive material 130 (Operation 1200) as shown in FIG. 4.

Here, FIG. 4 is a schematic sectioned drawing sectional view for illustrating Step 1200.

The temporal order of Operations 1100 and 1200 is arbitrary.

The insulating adhesive sheet 131 is composed oft for example, an epoxy resin. Various kinds of insulating adhesive sheets are presently available.

The epoxy resin is a heat-curing adhesive, and although it is cured at 150° C., it is softened at about 80° C., and closely contacts to the package board 110 and exerts temporally joint effect.

The height of the insulating adhesive sheet 131 can determine the quantity of the conductive adhesive 140.

At the location corresponding to the site where the package board 110 is electrically connected to the printed circuit board 150, through holes 132 are formed in the insulating adhesive sheet 131 using a drill 134.

The pattern of the through holes 132 is formed corresponding to the pattern of the pads 116 so as to open or expose the pads 116 when adhered to the package board 110.

In an example embodiment, the insulating adhesive sheet 131 is rectangular, and has positioning holes in the four corners of the rectangle.

Figure 5:
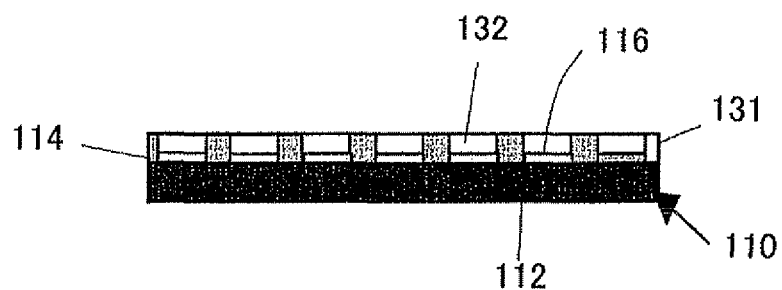
FIG. 5 is a schematic sectional view for illustrating Step 1300 shown in FIG. 3.

Next, as shown in FIG. 5, the insulating adhesive sheet 131 is positioned and temporarily joined to the back surface 114 of the package board 110 (Operation 1300).

Here, FIG. 5 is a schematic sectional view for illustrating Step 1300.

The through holes 132 are positioned on the site where the package board 110 is electrically connected to the printed circuit board 150, specifically, the pads 116.

In an example embodiment, the positioning of the package board to the insulating adhesive sheet 131 is carried out by matching the positioning holes of the both and stopping with pins.

Although mechanical positioning is adopted in an example embodiment as described above, the method for positioning is optional.

For example, positioning may be carried out using optical by providing alignment marks on the both.

Temporary joint is carried out by preheating the package board 110 and the insulating adhesive sheet 131 at, for example, about 80° C.

After preheating, the positioning pins are removed. By Operation 1300, an insulating adhesive material 130 can be temporarily adhered on the package board 110 around the pads 116 so as to expose the pads 116.

Next, a conductive adhesive 140 is prepared (Operation 1400).

As described above, the conductive adhesive 140 is composed of a heat-curing adhesive containing metal particles 143 as a filler having a first melting point whose surfaces are plated with a low-temperature melting solder 144 having a second melting point lower than the first melting point and the thermosetting temperature of the heat-curing adhesive 148.

The heat-curing adhesive 148 of an example embodiment is an epoxy resin whose heat curing temperature is 150° C.

The metal particles 143 are high-melting-point metal particles in an example embodiment, for example, Cu or Ni particles, whose melting point is higher than the heat curing temperature of the heat-curing adhesive 148.

The low-temperature melting solder 144 is composed of, for example, Sn—Bi, and the melting point thereof is 138° C. The melting point of the low-temperature melting solder 144 is preferably lower than the heat curing temperature of the heat-curing adhesive 148.

This is for the purpose that the heat-curing adhesive 148 is not heat-cured before the low-temperature melting solder 144 is melted.

As described above, the conductive adhesive 140 is a bond material containing conductive filler which is composed of high-melting-point metal particles 143 as a cure and whose surface is plated with the low-temperature melting solder.

Various particle diameters of metal particles are presently available.

In an example embodiment, the surfaces of the metal particles 143 are plated with a low-temperature melting solder by electroless plating.

The plating thickness of the surfaces of the metal particles 143 can be controlled, for example, by the time of immersing in the aqueous solution.

Of course, an example invention is not limited to a specific plating method.

The conductive adhesive of an example embodiment has a certain number of satisfactory performances including conductivity, melting temperature, re-melting temperature, and joining force.

If conductivity is insufficient, the electrical connection of the package board 110 to the printed circuit board 150 becomes unstable, and the electrical properties of the hybrid printed circuit board 100 are deteriorated.

If the melting temperature is high, thermal stress and thermal strain acting between the package board 110 and the printed circuit board 150 (i.e., received by the conductive adhesive 140) are enlarged, thereby undesirably causing damage in both boards and the conductive adhesive 140.

Therefore, it is preferable that the melting temperature is lower.

On the other hand, when electronic parts are mounted on the hybrid printed circuit board 100 in a subsequent steps, if the re-melting temperature is low, the conductive adhesive 140 starts melting at about 250° C., and joining force and conductivity is undesirably lost.

Therefore, it is preferable that the re-melting temperature is at least 250° C.

It is also preferable that joining force is higher than the joining force of conventional silver paste using silver filler for maintaining stable conductivity and laminated structure.

The conductivity by the conductive adhesive 140 depends on the content of the metal particles 143 and plating.

The melting temperature of the conductive adhesive 140 is the melting point of the plating.

In an example embodiment, since a low melting-temperature solder consisting of Sn—Bi (tin-bismuth) is used, the melting temperature is 138° C. The re-melting temperature of the conductive adhesive 140 can be controlled by controlling plating thickness and the particle diameter of the filler.

Since the filler and the solder act as an alloy once the solder melts, the re-melting temperature can be elevated by the filler.

Figure 9:
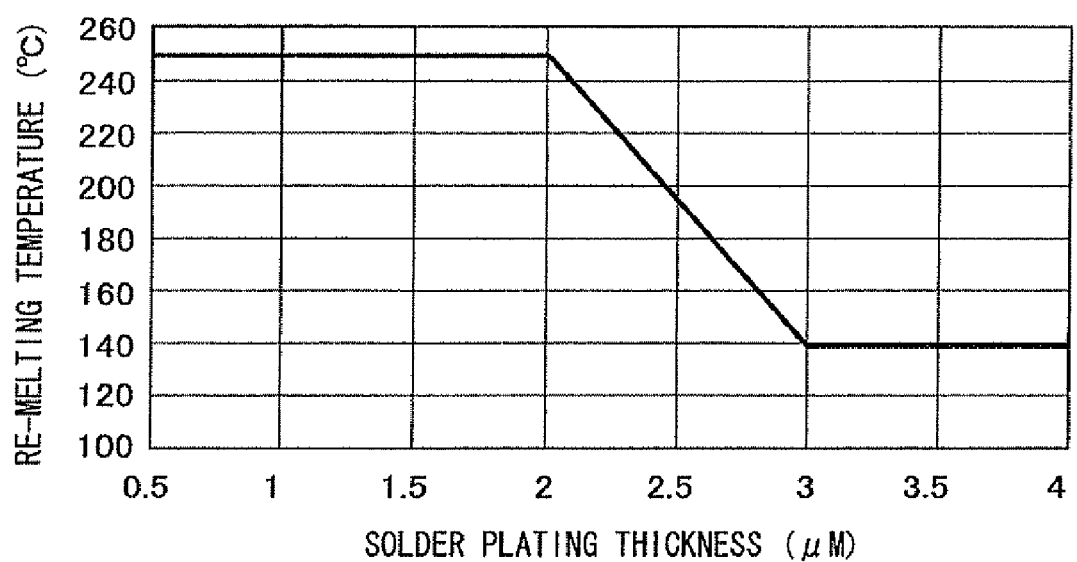
FIG. 9 is a graph showing an example relationship between a thickness of solder plating used for a conductive adhesive and the re-melting temperature in Step 1400 illustrated in FIG. 1.

FIG. 9 shows relationship between the Sn—Bi plating thickness and the re-melting temperature when filler (Cu) content is 90% and particle diameters are 20 to 40 μm.

Since the solder is not completely diffused and remains when the plating thickness exceeds 2 μm, the re-melting temperature lowered to the vicinity of the melting point of Sn—Bi.

To the contrary, when the plating thickness is 2 μm or less, Sn—Bi is completely diffused, and the re-melting temperature becomes substantially constant.

On the other hand, the plating thickness reinforces the joining force of the conductive adhesive 140. Therefore, the more the quantity of solder, the more the joining force elevates.

However, as described above, a large solder quantity is not preferable because the re-melting temperature lowers. Therefore, the plating thickness must be determined so that the conductive adhesive 140 achieves a good balance between specified joining strength and the re-melting temperature (reliability).

The graph shown in FIG. 9 is shifted to the right if the particle diameter is larger than 40 μm, and is shifted to the left if the particle diameter is 20 μm or smaller.

In general, for metal particles having a particle diameter of 100 μm or less used as the filler, a predetermined joining strength can be maintained when plating thickness of Sn—Bi is 1 μm or more.

The graph shown in FIG. 9 is also varied depending on the kinds of the filler and solder to be used.

Therefore, the kind and thickness of the above-described solder plating, and the kind, particle diameter and content of the filler are appropriately selected to meet such performances.

In the present embodiment, it was confirmed that when the metal particles were Cu particles (particle diameter: 20 to 40 μm) whose surfaces were solder plated (plating thickness: 2 μm), the re-melting temperature was 350° C. or higher.

The conductive adhesive 140 has an curing agent containing any one of carboxyl groups, amine, and phenol; and an organic acid containing carboxylic acid of any one of adipic acid, succinic acid, and sebasic acid.

Thereby, the activation (or wetness) of the solder can be improved. Specifically, the characteristics to prevent oxidation and to penetrate into the package board 110 can be improved.

Figure 6:
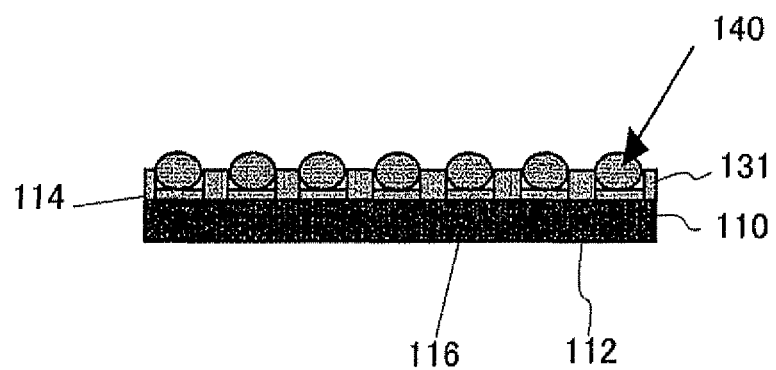
FIG. 6 is a schematic sectional view for illustrating Step 1500 shown in FIG. 3.

Next, as shown in FIG. 6, the conductance bond material conductive adhesive 140 is filled in the through holes 132, and applied on the pads 116 (Operation 1500).

Although filling is carried out by screen printing using a metal mask in an example embodiment, an example invention does not limit the filling method thereto.

Although the insulating adhesive material 130 and the conductive adhesive 140 are disposed on the package board 110, these may be disposed on the printed circuit board 150.

Next, the printed circuit board 150 is fabricated (Operation 1600).

The temporal order of Operations 1600 and 1100 to 1500 is arbitrary.

On the surface 152 of the printed circuit board 150, a dent 154 is formed by molding.

The shape of the dent 154 is formed to be rectangular parallelepiped similar to the package board 110, and slightly larger than the package board 110.

The depth of the dent 154 is the sum of the thickness of the package board 110, and the thicknesses of the pad 116, the footprint 158 and the conductive adhesive 140.

Since surfaces 112 and 152 form the same plane, the volume of the dent 154 is equal to the volume of the package board 110, the bond materials 130 and 140, the pad 116, and the footprint 158.

The footprint 158 is formed on the bottom 155 of the dent 154.

The pattern arrangement of the footprint 158 is identical to the pattern arrangement of the pad 116.

Figure 7:
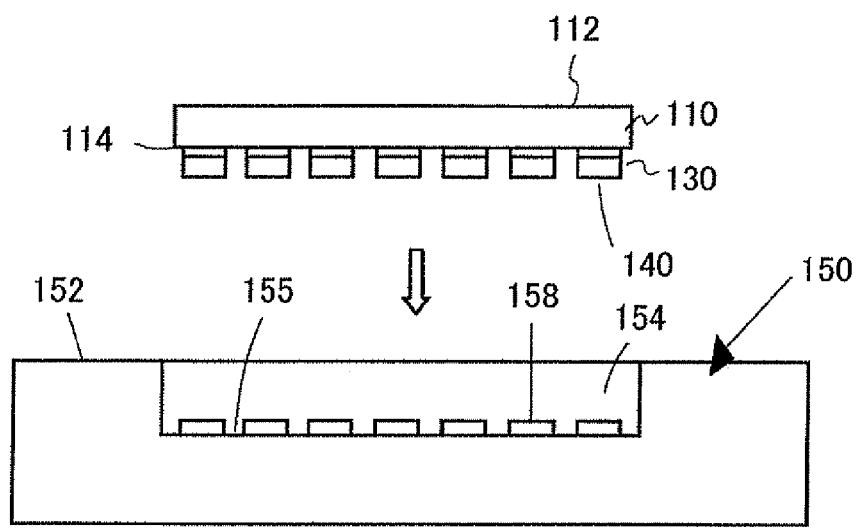
FIG. 7 is a schematic sectional view for illustrating Step 1700 shown in FIG. 3.

Next, as shown in FIG. 7, the package board 110 is positioned in the dent 154 of the printed circuit board 150 with the back surface 114 down and fitted (Operation 1700).

Although the dent 154 is formed to meet the outer shape of the package board 110, if required, the dent 154 is adjusted to the postures of the package board 110 in the vertical direction and the horizontal direction to the page of FIG. 7.

Positioning may also be carried out by taking photos of alignment marks (not shown), with an imaging means and an optical system, drawn on the package board 110 and the bottom 155 of the dent 154 of the printed circuit board 150.

Next, the package board 110 is compressed to the printed circuit board 150 by heating and pressing with a vacuum press (Operation 1800).

As a result, the insulating adhesive material 130 and the conductive adhesive 140 melt, and the package board 110 and the printed circuit board 150 form the same plane on the surfaces 112 and 152.

Figure 8:
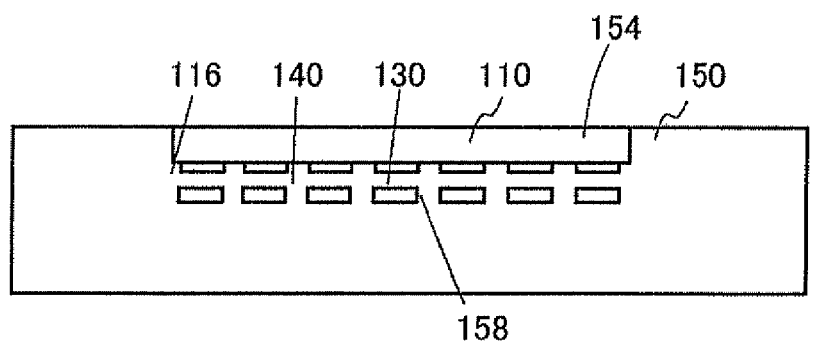
FIG. 8 is a schematic sectional view for illustrating Step 1800 shown in FIG. 3.

Then, the hybrid printed circuit board 100 shown in FIG. 8 is formed.

The temperature when the package board 110 is joined to the printed circuit board 150 is low because of the melting point of the low-temperature melting solder 144.

Therefore, the thermal stress and thermal strain in joining can be lowered, and the reliability of joining between the both can be secured even if difference in coefficients of thermal expansion between the package board 110 and the printed circuit board 150 is large.

The conductivities of metal particles 143 and low-temperature melting solder 144 can also be secured.

Although the metal particles 143 are preferably lead-free for environmental conservation, in an example embodiment, lead-free can be easily realized because no BGA balls are used.

In such a hybrid printed circuit board, the package board 110 and the printed circuit board 150 form the same plane on the surfaces 112 and 152, and the package board 110 is not protruded from the printed circuit board 150. Therefore, the handling of the package board 110 is improved without being caught by exterior members.

Finally, as shown in FIG. 2, electronic parts are collectively mounted on the package board 110 to complete the printed circuit board 150.

The electronic parts are the LSI 120, and electronic parts 126 and 160.

For mounting the LSI 120, the printed circuit board 150 is placed in a reflow furnace.

Figure 10A:
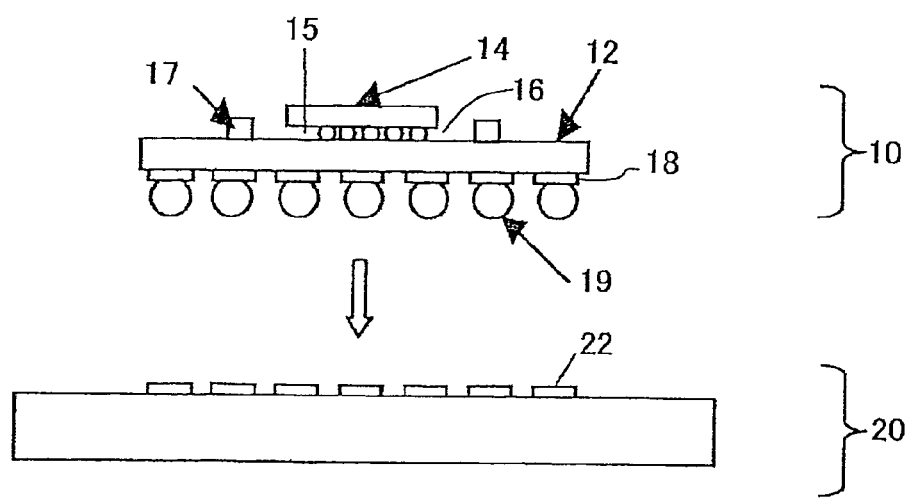
FIG. 10A is a sectional view for illustrating the manufacture of a conventional hybrid printed circuit board.
Figure 10B:
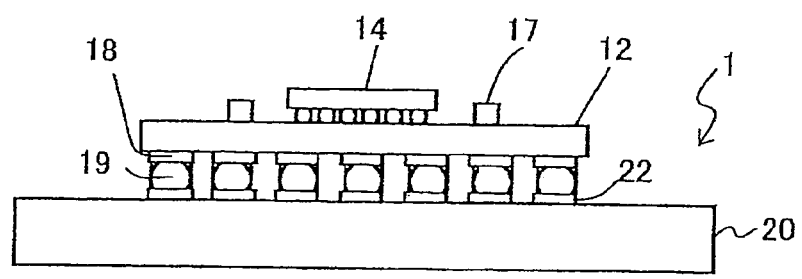
FIG. 10B is a sectional view for illustrating the manufacture of the conventional hybrid printed circuit board.

As described above, when flip chips such as the LSI 120 is mounted after Operation 1800, no reflow step is performed after mounting flip chips as shown in FIGS. 10A and 10B; therefore, the electrical properties can be stably maintained without the short-circuiting of the flip chips and adhesion lowering of under-fills.

Also since the same plane is formed by the surfaces 112 and 152, electronic parts can be mounted on the package board 110 and the printed circuit board 150 at the same time.

Since the electronic parts can be mounted at once, the manufacturing efficiency can be improved.

Furthermore, once the low-temperature melting solder 144 is melted, the filler and the solder act as an alloy, and the high-melting-point metal particles make the melting point of the conductive adhesive 140 higher than the melting point of the low-temperature melting solder 144.

Thereby, the re-melting temperature of the conductive adhesive 140 can be made higher than the melting point of the low-temperature melting solder 144.

Therefore, even if a flip chip such as the LSI 120 is mounted on the hybrid printed circuit board 100, the conductive adhesive 40 does not re-melt, and the electrical properties can be stably maintained.

Specifically, the reflow temperature when the flip chip is mounted on the package board 110 is preferably lower than the melting point of the metal particles 143.

As described above, according to an example invention, a hybrid printed circuit board, an electronic apparatus having such a hybrid printed circuit board, and a method for manufacturing such a hybrid printed circuit board can be provided.

Although embodiments of an example invention have been described above, an example invention is not limited to these embodiments, but various variations and modification can be made within the range of the spirit of an example invention.

For example, in an example embodiment, although the dent 154 is formed in the printed circuit board 150, no dent may be formed, the package board 110 may be protruded from the printed circuit board 150, and surfaces 112 and 152 may not form the same plane.

Alternatively, a convex portion may be formed in place of the dent 154. Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method for manufacturing a hybrid printed circuit board having first wiring board having a first terminal and a second wiring board having a second terminal, the second wiring board having a dent with the second terminal, comprising:
   temporarily applying an insulating adhesive material around the first terminal so that said the first terminal is exposed;
   applying a conductive adhesive on the first terminal;
   fitting the first wiring board in the dent of the second wiring board so that the first terminal contacts the second terminal via the conductive adhesive,
   compressing and heating the first wiring board to the second wiring board so that the second wiring board and the first wiring board form the same plane; and
   mounting a first electric part on the first wiring board and a second electric part on the second wiring board in a single reflow process after the compressing and heating.

2. The method for manufacturing a hybrid printed circuit board according to claim 1, wherein the conductive adhesive is a heat-curing adhesive, the conductive adhesive containing what is plated with a low-temperature melting solder on surfaces of metal particles as a filler, the metal particles having a first melting point, the low-temperature melting solder having a second melting point lower than the first melting point and a heat curing temperature of the heat-curing adhesive.

3. The method for manufacturing a hybrid printed circuit board according to claim 1, wherein the first electric part further comprises a flip chip and the reflow temperature when the flip chip is mounted on the first wiring board is lower than the first melting point.

* * * * *

UNITED STATES PATENT AND TRADEMARK OFFICE
CERTIFICATE OF CORRECTION

| | | |
|---|---|---|
| PATENT NO. | : 8,061,022 B2 | Page 1 of 1 |
| APPLICATION NO. | : 12/046961 | |
| DATED | : November 22, 2011 | |
| INVENTOR(S) | : Takashi Kanda | |

It is certified that error appears in the above-identified patent and that said Letters Patent is hereby corrected as shown below:

Column 8, Line 37, In Claim 1, after "having" insert -- a --.

Signed and Sealed this
Thirty-first Day of January, 2012

David J. Kappos
*Director of the United States Patent and Trademark Office*